United States Patent [19]
Lindner et al.

[11] Patent Number: 5,172,472
[45] Date of Patent: Dec. 22, 1992

[54] MULTI-LAYER RIGID PROTOTYPE PRINTED CIRCUIT BOARD FABRICATION METHOD

[75] Inventors: Frederick H. Lindner, Canaan; Paul A. Duncanson, Franklin, both of N.H.

[73] Assignee: Direct Imaging Inc., West Lebanon, N.H.

[21] Appl. No.: 745,314

[22] Filed: Aug. 15, 1991

[51] Int. Cl.⁵ .............................................. H01R 9/14
[52] U.S. Cl. ...................................... 29/845; 29/838; 174/266; 174/267; 361/414
[58] Field of Search ................. 29/845, 838; 174/266, 174/267; 361/414

[56] References Cited

U.S. PATENT DOCUMENTS

| | | | |
|---|---|---|---|
| 4,562,301 | 12/1985 | Kameda et al. | 29/845 X |
| 4,644,643 | 2/1987 | Sudo | 361/414 X |
| 4,653,186 | 3/1987 | Kamijo et al. | 174/267 X |

FOREIGN PATENT DOCUMENTS

| | | | |
|---|---|---|---|
| 2807874 | 8/1979 | Fed. Rep. of Germany | 129/845 |
| 2840890 | 4/1980 | Fed. Rep. of Germany | 29/845 |

Primary Examiner—Carl J. Arbes
Attorney, Agent, or Firm—Sughrue, Mion, Zinn, Macpeak & Seas

[57] ABSTRACT

A multi-layer rigid prototype printed circuit board is fabricated by applying a heat activated, rapid setting or tacking melt-remelt adhesive utilizing a moderate temperature heat laminating device onto appropriate surfaces of pre-etched and plated insulative film based, flexible film layers. A computer guided drill drills through-holes within an electrical insulative material planar substrate core using prescribed drill sizes for each through-hole pin size desired for a given hole location. The etched layers with the adhesive applied are positioned in proper sequence aligned to the drilled hole pattern and heat laminated thereto as a stacked array on the top and/or bottom surfaces of the substrate core. Computer guided drilling of the adhered films with prescribed smaller drill sizes at each through-hole location is effected to create film cantilever portions extending radially outwardly of the edge of the through-holes. Unique, polygonal or like cross-section through-hole connector pins are inserted into the aligned holes within the flexible film layers and the substrate, with the pins having at least one radial projection forming a sharp corner which cuts into the conductor tracks of the multi-layer flexible film array to deflect and deform the cantilever edge portion of the multi-layer flexible films into the substrate through-holes for effecting a low impedance conductor track to pin to conductor track electrical connection for a plurality of the films. The conductor tracks at the cantilever edge portions may be provided with a solder film and heat applied by post-heating the through-hole connector pins or otherwise to facilitate a low impedance connection between the periphery of the through-hole connector pin and the conductor tracks of the multi-layer flexible film array. The application of heat remelts the adhesive facilitating flexing of the multi-layer flexible films and ensuring contact between the conductor tracks and the pin periphery.

13 Claims, 4 Drawing Sheets

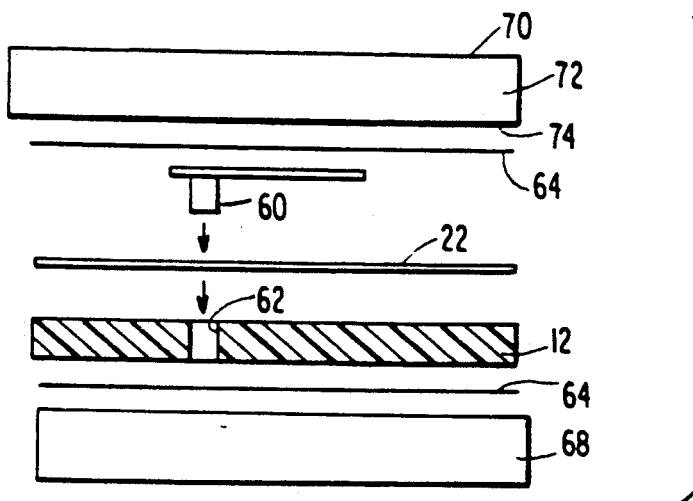
FIG. 4
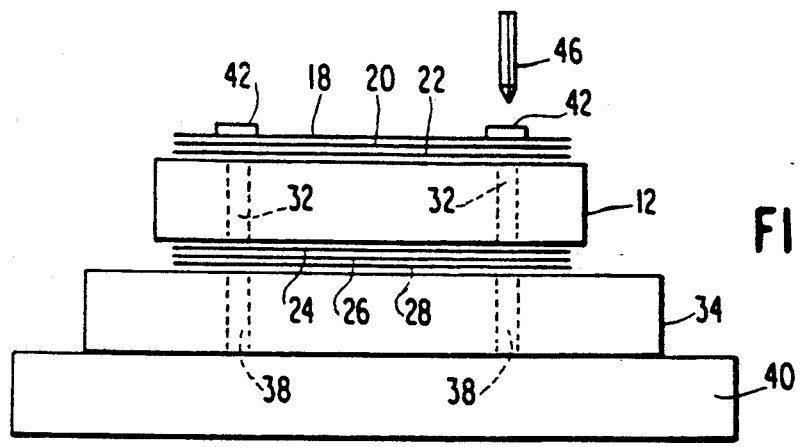
FIG. 5
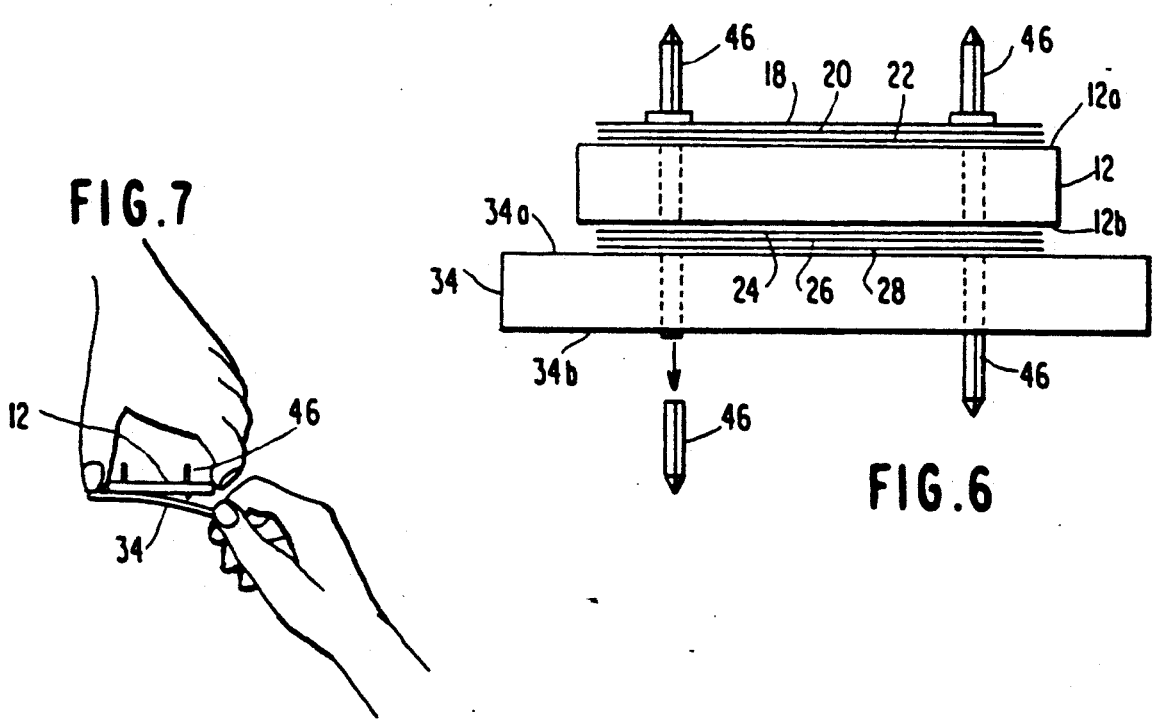
FIG. 7
FIG. 6

POSITIVE IMAGE OF POSITIVE TARGET     NEGATIVE IMAGE OF NEGATIVE TARGET     POSITIVE IMAGE OF NEGATIVE TARGET

MULTI-LAYER RIGID PROTOTYPE PRINTED CIRCUIT BOARD FABRICATION METHOD

FIELD OF THE INVENTION

This invention relates to the manufacture of prototype printed circuit boards and more particularly to a computer aided process for drilling hole sizes within a substrate thereof for effecting inter-layer electrical connections and, facilitating the connections between conductor foils by deformation of multilayer laminated, flexible sheets applied such to double sided substrate.

BACKGROUND OF THE INVENTION

Multi-layer rigid prototype fabrication requires special techniques. Generally, multi-layer rigid circuit board prototype fabrication involves drilling a board-hole pattern via a NC driller where the hole sizes are determined by the size of the pins effecting inter-layer connections at particular holes. Dry sheet adhesive is then applied to the proper side of each circuit layer produced by a plotter/etcher. Such plotter/etcher created circuit layer, maybe effected by a computer aided-etcher as set forth in U.S Pat. No. 4,767,489 issued Aug. 30, 1988 to co-applicant Frederick H. Linder, and assigned to the common corporate assignee.

The layers are then prepared and laminated to each side of a rigid substrate. Post drilling of the laminated assembly is the next step along with routing out the board outline using such NC driller. The prototype PC board is finished by installing pins or connectors in the appropriate holes from the components side. This may involve populating the Board with components and soldering as a final step before testing the design.

While the computer aided printer-etcher greatly facilitates the manufacture of a multi-layer rigid prototype printed circuit board and while, U.S. Pat. No. 4,767,489 states that the techniques in further treating the printed circuit film 19 after passage through the printer-etcher unit of that patent, are conventional such is true for double-sided printed circuit boards. However, in order to apply the printer-etcher to producing a prototype or experimental multi-layer printed circuit board, inter-connection of the multiple conductor tracks of the stacked layers utilizing prior art techniques are tedious, complex and time consuming.

It is therefore primary object of the present invention to accomplish the inter-connection between conductor tracks of multiple layers of a double-sided prototype printed circuit board by electroless tin plating and utilizing uniquely designed, exterior shaped through hole pins having several sharp corners for physical distortion of the thin flexible films to accomplish by pin penetration, the required multi-layer track inter-connections.

SUMMARY OF THE INVENTION

The present invention accomplishes in one preferred form, the objects by first electroless tin plating the etched layers and then applying uniquely designed hexagonal shaped (outside diameter) through-hole pins in a carefully prescribed sequential process involving:

1. Application of a heat activated, rapid setting or tacky melt/remelt adhesive utilizing a moderate temperature heat lamination device, onto the appropriate surfaces of the etched and plated film layers;

2. Computer guided drilling of an insulator material (core) with prescribed drill sizes for each pin size desired for a given hole location;

3. Application of the etched layers with adhesive onto the core in proper sequence, aligned to the drilled hole pattern utilizing, again, a moderate temperature heat lamination device;

4. Computer guided drilling of the adhered films with the prescribed drill sizes for each pin size desired for a given location as in Process 2 except for drill size;

5. Insertion of the appropriate unique pin (see FIGS. 6, 7 and 8 for pin design) into the proper hole with enough force to bottom the 0.010" thick shoulder on the uppermost layer. During this process the bottom layers are supported by an insulating material board similar to the core (Process 2) except that the drilled hole sizes are also uniquely sized for the particular hole location.

The multi-layer assembly is now ready to be populated with components and hand soldered to complete the fabrication process. Solder reflow occurs between the OD of the pin and the layers of the films which have been distorted during the insertion. The distortion of the films by the unique pin design is crucial to the achievement of acceptable layer inter-connection. The interaction of the pin design and hole size selections of the various materials (core, film, etc.), allow the invention to accomplish the desired objective of utilizing the printer-etcher film output to quickly fabricate a prototype or experimental multi-layer printed circuit board.

BRIEF DESCRIPTION OF THE DRAWINGS

FIG. 4 is a schematic, exploded elevational view of the stacked assembly of FIG. 3 during the registration and lamination steps.

FIG. 5 is a schematic elevational view of the printed circuit board assembly illustrating the installation of the pins through the pre-drilled substrate or core and the flexible film laminates on opposite sides of the substrate.

FIG. 6 is a schematic elevational view of the assembly illustrating the severance of the projecting ends of the pins within the through holes of the substrate core and the back up board.

FIG. 7 is a perspective view of the step of removal of the backup board prior to populating the printed circuit board with components and hand soldering of the pins.

DESCRIPTION OF THE PREFERRED EMBODIMENT

As may be appreciated, the multi-layer rigid prototype printed circuit board may be fabricated with six flexible conductive metal sheets, three to each side of a rigid substrate for the board, or any number of layers from one to five or more, on each side. In that respect, in FIGS. 1–9 inclusive, the preferred embodiment is described as employing three flexible film layers to each side of the substrate, while in the embodiment of FIGS. 11 and 12, the only change is the utilization of four flexible film layers on top and bottom surfaces of the rigid substrate and adhered thereto via the adhesive layer of the flexible metal clad sheets proximate to the rigid substrate.

Figure 1:
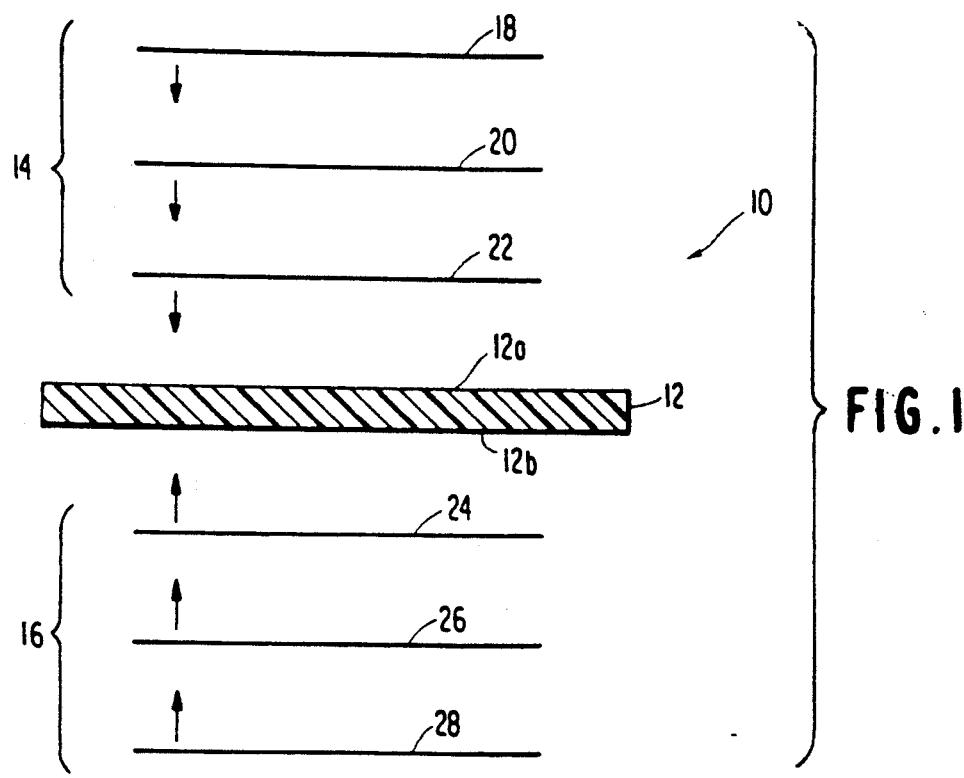
FIG. 1 is a schematic, exploded elevational view of a six-layer prototype printed circuit board forming a preferred embodiment of the invention.
Figure 2:
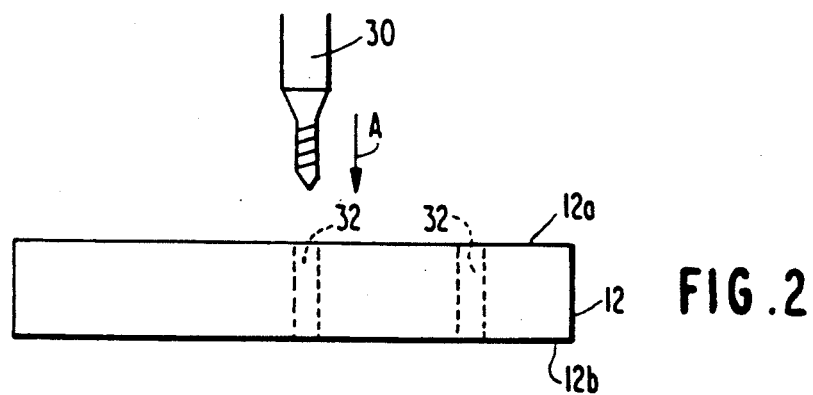
FIG. 2 is a elevational view of the substrate or core blank of the printed circuit board of FIG. 1 during initial drilling of through holes under computer control.

Referring to FIG. 1, the six layer board printed circuit rigid prototype printed circuit board 10 is illustrated as being constructed from a suitable substrate or core 12 of flat planar form, comprised of an electrical insulation material as for instance a core sheet formed of a FR-4 glass epoxy, having on an upper surface 12a of that substrate, a multi-layer stacked flexible film assembly indicated generally at 14 and formed of a 3 flexible sheets or layers 18, 20 and 22, in that order, as a stacked array. The sheets 18, 20 and 22 are adhesively connected to each other, and in turn the lower most layer 22 is adhesively bonded directly to the upper surface 12a of the substrate 12.

The bottom surface 12b of the substrate 12 has applied thereto, by means of an adhesive film on flexible sheets 24, 26 and 8, a laminate structure or stacked flexible film assembly 16. The uppermost flexible layer 24 is applied to the bottom surface 12b of the substrate 12 by means of an adhesive film which, in this case, as well as the case of layer 22, is applied to the conductive film of these two layers, that is the adhesive overlays the metal foil surface of the sheet. Preferably, the upper surface of layers 18, 20, 22, 24 and 26 have a film of copper, applied herein while the lower surface of the lower most sheet 28 in stack 16 is copper coated with the adhesive on the upper surface of the sheet or layer and facing the immediately above layer 26.

After registration by using the four registration pin clips, insertion of the substrate board 12 into a laminator for two minutes effects thermal loading of layer 22 to the substrate core 12. This step is repeated for layers 18 and 20 on the top side of the printed circuit board 10 and for layers 24, 26 and 28 in order for the bottom side of that board. It is important that all layers 18, 20, 22, 24 and 26 are copper-side up except for the layer 28 whose copper side faces downwardly to facilitate soldering to the exposed lower ends of the special form component hollow lead receiving through hole connector pins at each of the land positions for the conductor tracks.

In the use of the laminator 70, FIG. 4, to laminate each flexible sheet or layer individually onto respective top or bottom of the printed circuit board core 12, registration pins 60 are required, (one of which is shown in FIG. 4). Each registration pin 60 is inserted into one of the 0.125 inch diameter punched or drilled holes in the films such as layer 22 in the copper coated flexible film layer 22 to be adhesively applied to the core 12. Next the end of the pin 60 sticking out below the flexible layer 22 is inserted into the correct predrilled hole 62 in core 12, as FIG. 4. Next, the next corner of the film to be pinned is lifted, as for instance, diametrically opposite to the first pin 60 and the next registration pin 60 positioned within that hole. It is to be noted that the film cannot be laid over the hole in the core 12 and the registration pin 60 merely pressed into the hole, since this will distort the hole within the layer 22. The process proceeds in a like manner for all four corners, although it is not necessary to proceed in a circumferential sequence. Registration of each layer to the next as at 18, 20, 22, 24, 26 and 28 is thus assured. Placement of the flexible layer assemblies 14, 16 in the laminator between sheets of release paper 64 with the newly pinned side up is effected prior to closing down of the laminator 70 causing the complete assembly 66 to be maintained between a foam pad 68 and the laminator 70. The laminator 70 uses a heat conducting member 72 to provide a heater surface 74 proximate to a layer such as 22 to be adhesively joined to the upper surface 12a of the printed circuit board core 12 and completes the positioning requirements prior to heat application by energizing of the heater 70. Such heaters having a planar member of heat conductive material for uniformly heating the surfaces of the stacked elements of the laminate assembly 66 are well known in the art. Using the materials of the illustrated embodiment, once the laminator 70 is closed, heat should be applied for approximately one minute to render the adhesive in sheet form to render the adhesive in sheet form tacky.

Figure 11:
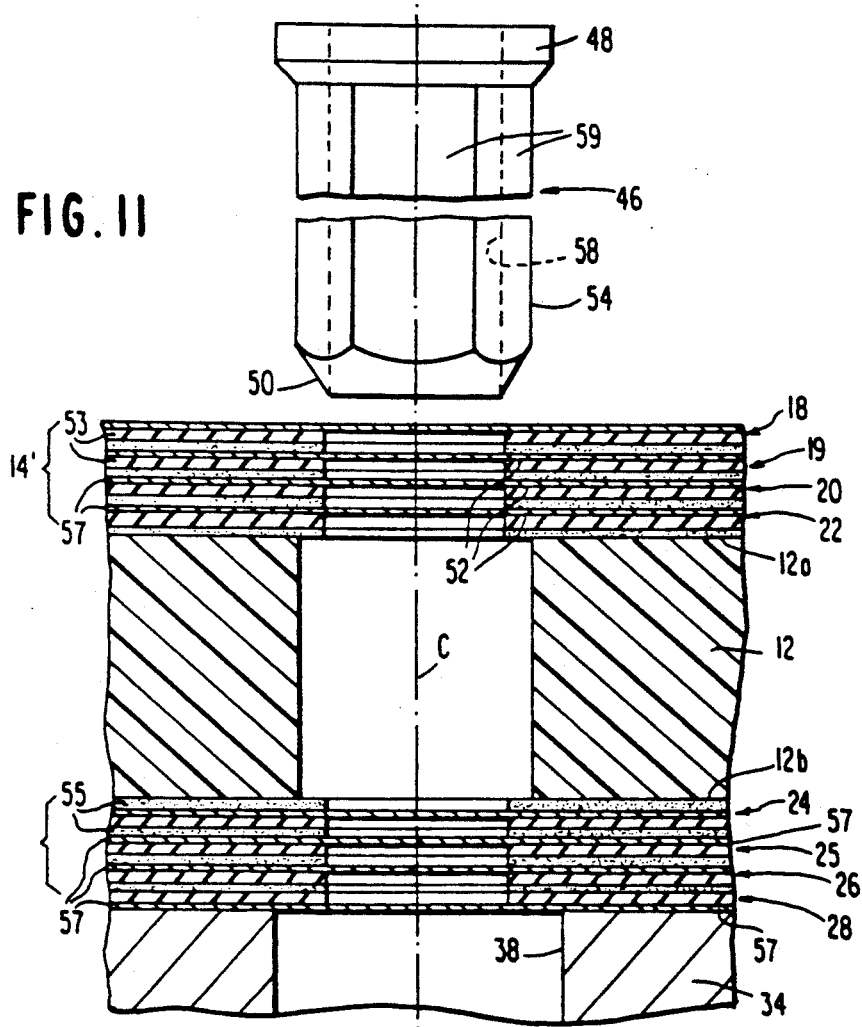
FIG. 11 is an enlarged vertical, exploded sectional view through the assembly of the back-up board, the substrate or core and the laminated adhesive coated films on the component side of the substrate or core and a pin forming a variation the preferred embodiment of the invention of FIG. 1.

The process described with respect to FIG. 4 is repeated proceeding one layer at a time for all layers 18, 20, 22, 24, 26 and 28 as per FIG. 1, (or the same layers with additional intermediate layers 19 and 25 as per FIG. 11). This causes the core and all layers to be laminated to each other and to core 12 via the heat-reheat adhesive. At this point, the four registration pins 60 are removed. The completed assembly 66 is then returned to the driller/router for post drilling of the flexible film layers making sure that the core 12 is installed in the same orientation as when original drilling Was effected as per the first step 1. The printed circuit board 10' in accordance with the processed steps to this point is ready for post-drilling.

The next step is the placement of the printed circuit board with the component side up and with the six flexible layers 18, 20, 22, 24, 26 and 28 adhesively adhered to the pre-drilled substrate 12 into the driller and orienting it correctly on the fixture using the optical alignment punch on the upper conductive surface of layer 18 to facilitate that process. In drilling by a carbide drill 30 in accordance with FIG. 3, the printed circuit board 10 is supported by a piece of scrap backup material, such that the carbide drill 30 may penetrate the upper surface of the scrap backup material board 36. The same hole pattern is drilled in this step as used on the printed circuit board substrate core 12 with the drills being used of a size recommended for the film conductive film layers 18, 20, 22, 24, 26 and 28 for the particular electrical connector pins to be later inserted, all in accordance with the discussions of drill size for the core as for the first step, and the drilling of the backup board in the second step.

In this step, a number 47 drill maybe employed for a HEX 67 electrical connector pin (0.067 ID); a number 62 drill for a HEX 38 pin (0.038 ID); a number 66 drill for a HEX 31 pin (0.031 ID); a number 74 drill for the 0.025 square pins; and a number 77 drill for the 0.018 square pins. These drill sizes are of course exemplary for the embodiment discussed as is the drill selection in steps one and two.

Figure 3:
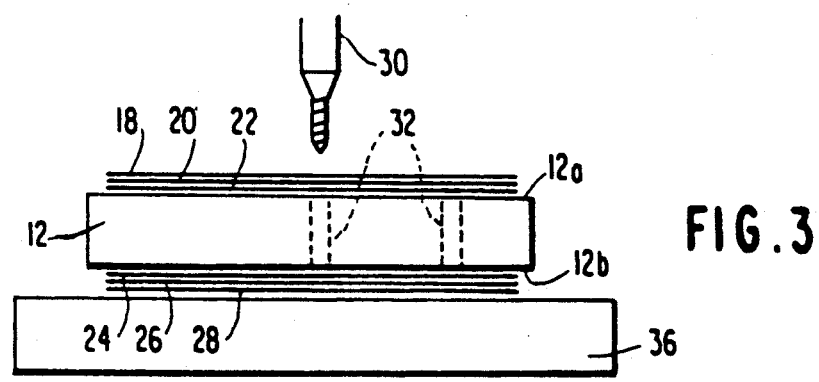
FIG. 3 is an elevational view of the stacked assembly of the printed circuit board of FIG. 1 during drilling of the six flexible layers, three of which are applied to respective opposite faces of the pre-drilled substrate or core blank.

The post drilled assembly 35 with the flexible films stacked as per FIG. 3 are removed from the driller. By use of a sharp knife and a straight edge, all excessive flexible film layers of 18, 20, 22, 24, 26 and 28 are cut away from the outside of the printed circuit board core 12 border and the waste is peeled and discarded. It may be necessary to cut slightly inside the router path. Upon removal of all waste from top and bottom sides of the assembly, FIG. 3, after removal from the scrap material backup material board 36, the substrate 10 with the films adhered thereto are returned to the driller for routing.

The next step is to route the board out, which step is effected by using a one eighth inch diameter bit which describes a path routing the outside of the board. For instance, the ultimate printed circuit board may have a square plan configuration only six inches by six inches although the exterior shape of the substrate or core 12 may be irregular, or rectangular with two sides longer than those at right angles thereto.

Figure 12:
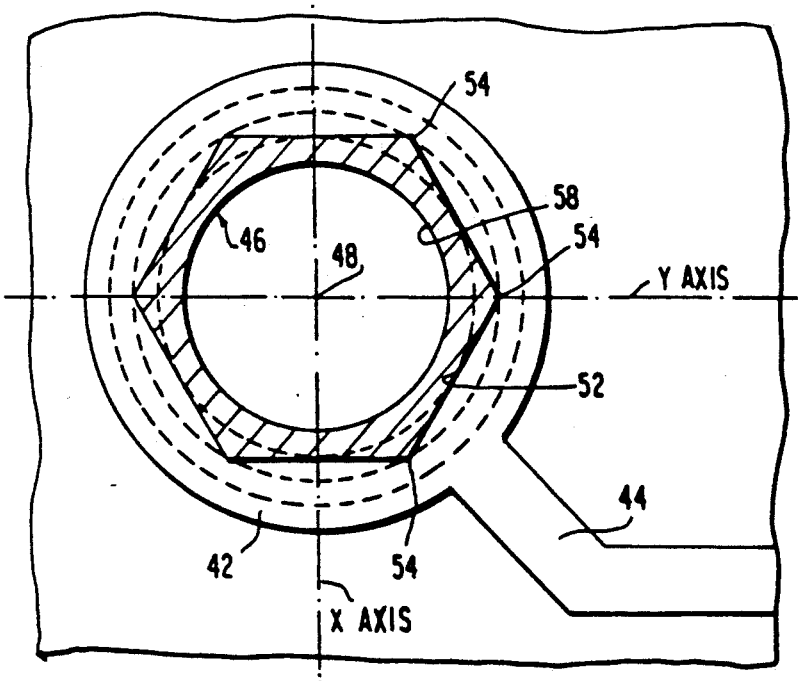
FIG. 12 is a transverse sectional view of the pin within a typical pad on one of the flexible, circuit films forming a flexible laminated structures on opposite sides of the rigid substrate core of the prototype printed circuit board of FIG. 10.

The next step, FIG. 5, is the placement of a backup board 34, component side up, onto a piece of translucent foam 40 with the backup board bearing pre-drilled holes 38 aligned with the predrilled holes 32 within the substrate 12. The post drilled printed circuit board substrate core 12, component side up, is placed on top of the backup board 34. Two of the common registration pins may be installed at diametrically opposed corners of the core substrate 12 and the backup board 34. As seen in FIG. 5, once that relationship is effective for stack 66 of translucent foam 40, backup board 34, core substrate 12, the layers are applied adhesively to the top and bottom surfaces of the core 12, is ready for the installation of various different diameter and cross-sectional configuration through hole electrical connector pins as indicated generally at 46, FIG. 5. Such pins as at 46 penetrate the respective lands 42 of circular disk form at the end of conductive tracks 44 as etched from the copper foil component of each flexible layer 18, 20, 22, 24, 26 and 28 FIG. 1. As seen in the enlarged plan view at FIG. 12 the land axis or center 48, is at any given X and Y intersection as determined from the converted Gerber file. In FIG. 5, the lands 42 are shown as raised from the surface of the uppermost flexible layer 18 for illustrative purposes only, it being readily apparent that the land 42, FIG. 12 is of the same thickness as the conductor track 44 from which it extends at the termination point for the given through hole pin 46. After all of the through hole connector pins have been mounted to the substrate or core 12, and with the pins being of a length sufficient that they extend completely through the pre-drilled through holes 32, 38 within the core substrate 12 and the backup board 34, respectively, the pinned substrate 12 is removed, from the translucent foam sheet 40 with the backup board still 34 attached thereto.

The through hole pins 46 are then cut off where they protrude through the bottom surface 34b of the backup board 34, as per FIG. 6.

To remove the backup board 34 from the printed circuit board 10, the printed circuit board substrate 12 may be manually gripped and the backup board 34 flexed in the manner shown in the perspective view of FIG. 7. It is required that a gentle, upward pull be applied to the pinned printed circuit board 10 for the removing the pinned printed circuit board 10 off the backup board 34 during flexing of the same.

The next step is populating the completed printed circuit board 10, with components and, hand soldering of the electrical leads passing through the hollow through hole connector pins 46, FIG. 11 on the soldered sides of the printed circuit board 10, i.e., effecting soldering on the downwardly facing metal land on the outer surface of the multi-layer assembly 16 i.e., on the copper side of layer 28, FIG. 1.

Figure 13:
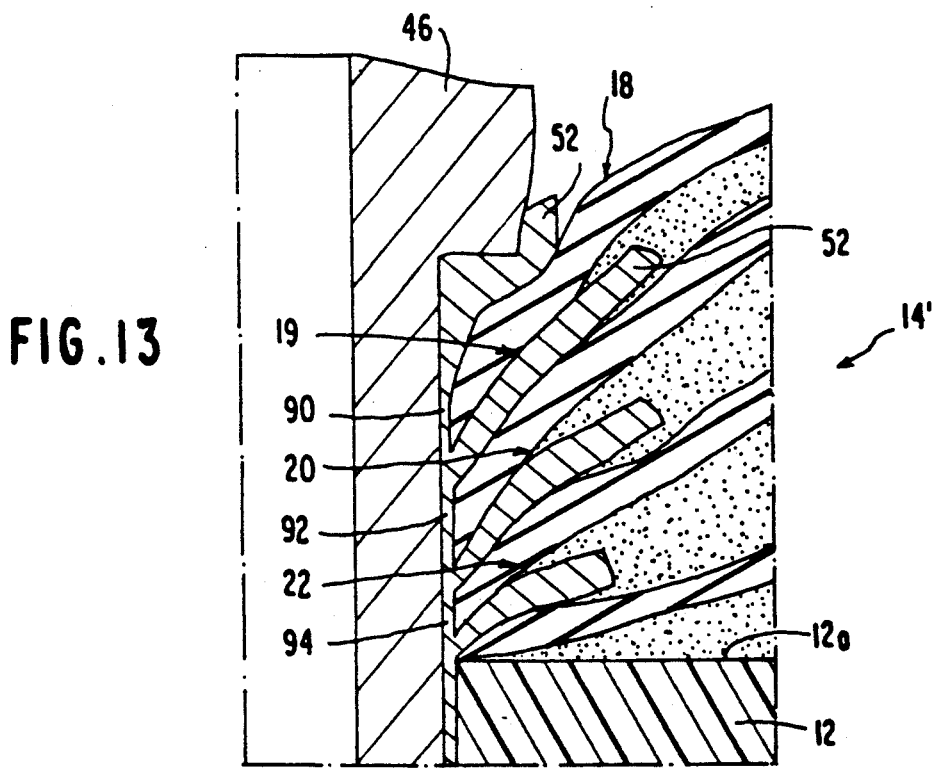
FIG. 13 is an enlarged, sectional view of a part of the prototype printed circuit board of FIG. 11 showing the completion of circuit connections between a through hole connector pin and the copper conduction tracks of a four layer flexible film array on the substrate core.

The manner in which the electrical circuit inter-connections are made by physical deformation of the flexible laminate layers of assemblies 14, 16, by a through hole connector pin such as 46 FIG. 11 may be better appreciated by reference to FIGS. 11, 12 and 13.

In the enlarged, plan view of FIG. 12 and vertical sectional view, FIG. 11 through the land 42 portion of the printed circuit board 10, aligned with the illustrated through hole pin 46 of that figure. The present invention accomplishes an excellent, low impedance electrical connection between all of the copper cladding foils or films of the individual layers of the stacked flexible sheet arrays 14' and 16' in the embodiment of the invention in FIG. 11, the only difference between the illustration FIG. 11 and that of FIGS. 1-10, is the utilization of four flexible layers each for the stacked multi-layer arrays 14' and 16' rather than the three layers each to respective opposite faces of the substrate 12 in the embodiment of FIG. 1.

The completed multi-layer printed circuit board 10 or 10' is now ready to be populated with components and hand soldering of component leads fed through hollow connector pins to complete the fabrication process. Solder reflow may also occur between the outside diameter of the pin and the copper foil of the film layers which have distorted and deformed the conductor lands during pin insertion. Such solder reflow may occur by post-heating of the connector pin, whose outer surface is tin plated or the like subsequent to the forced insertion into the aligned through holes of the assembly. The distortion of the flexible film layers by the unique configured through hole pin 46 is crucial to the achievement of acceptable copper layer to pin to copper layer electrical inter connection. The interaction of the pin design and the hole size selections of the various materials (core 12, flexible film layers etc.) allow the present invention to accomplish the desired objectives of utilizing the printer-etcher film output of U.S. Pat. No. 4,767,489 to quickly fabricate a prototype or experimental multi-layer printed circuit board such as that at 10, 10'.

As discussed previously, a further aspect of the present invention involves the use of a direct imaging optical punch (DIOP) which provides a simple and accurate means to register the flexible film layers of one to the other and to the pre-drilled FR-4 printed circuit board core 12. As described, four 0.125 inch registration pins 60 are included which are used to align the layers 18, 20, 22, 24, 26, 28 (and, optionally 19, 25) and the core 12. In order to use the punch, however, a slight alteration to the Gerber or pen plotter layouts is required. These alterations must be made prior to the initial conversion of the files in the system. Special targets are also needed in the tool library. As to the printed circuit layout requirements, the registration and lamination process requires four special targets and holes, ideally just outside of the four corners of the outline of the printed circuit board being fabricated and which are subsequential cut off as waste content of the flexible film layers 18, 20, 22, 24, 26 and 28 (and optionally layers 19 and 25 of the FIG. 11 embodiment). Mounting holes may be used if they are at the four corners and if they can accommodate the target pattern described hereinafter without problems.

Two unique flash tools must be used to allow the DI software to substitute the special target but the flash tool does not need to resemble this special target (even a simple, unique pad would suffice). All of the signal layers use as one "D" tool; and the ground and power planes, the other "D" tool designation since they are negated prior to imaging. For a pen plotter file, the special targets must be part of each layer file and a unique tool such as an Excellon tool used at those locations are required to be a part of the Excellon file.

As to target requirements, the key requirement of a target is the provision of a solid 124 mil. circle to be viewed through a microscope for precise centering. The following instructions facilitate the making of a readily recognizable target for both the positive and the negative targets. Moire or other types of target designs may be replaced by the illustrated targets.

Figure 8:
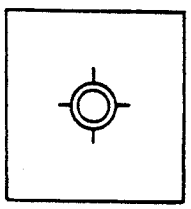
FIG. 8 is a layout of a menu select tool library for a computer control process facilitating the inter-connection of all circuit layers utilizing the special form pins of the present invention.
Figure 8:
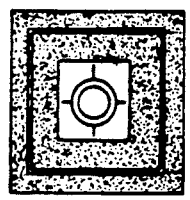
Figure 8:
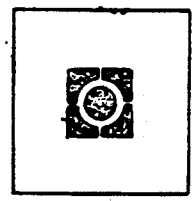
Figure 9:
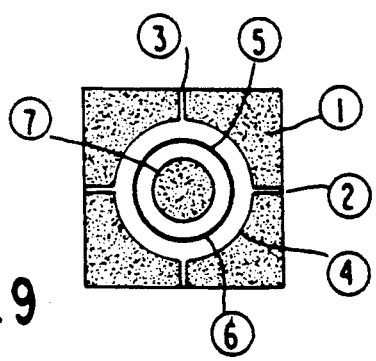
FIG. 9 is a graphic illustration of the steps required to create a negative target utilizing the computer controlled method of the present invention.
Figure 10:
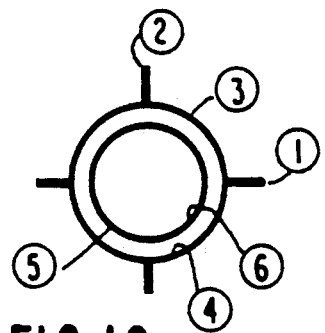
FIG. 10 is a graphic illustration of the steps required to create a positive target utilizing the computer controlled method of the present invention.

The "D" tool entry in the cross reference table must be assigned to the proper library number for the registration "target" tools for each layer. The positive target should be used for positive layers, usually all circuit layers such as layers 18, 20, 22, 24, 26 and 28, FIG. 1. The negative target should be used for negative layers usually the power and ground planes. When a negative target is negated it will be identical to the positive target when it is not negated. With respect to a typical menu select update "tool library" - add/modify tool, FIG. 7 illustrates the positive image of a positive target, a negative image of a negative target and a positive image of a negative target from left to right respectively. A sequence of steps required to create the negative target is as follows:

With reference to FIG. 8:
MENU SELECT: - UPDATE TOOL LIBRARY
- ADD/MODIFY TOOL
Steps Required to Create the Negative target:
1. Square - Solid
249
2. Rectangle - Empty
X = 240    Y = 15
3. Rectangle - Empty
X = 15    Y = 240
4. Circle - Empty
174
5. Circle - Solid
140
6. Circle - Empty
124
7. Circle - Solid
90
With reference to FIG. 9:
MENU SELECT: - UPDATE TOOL LIBRARY
- ADD/MODIFY TOOL -continued
Steps Required to Create the Positive target:
1. Rectangle - Solid
X = 240    Y = 15
2. Rectangle - Solid
X = 15    Y = 240
3. Circle - Solid
174
4. Circle - Empty
140
5. Circle - Solid
124
6. Circle - Empty
90

A 0.125" hole must be drilled at each of the target locations for the illustrated embodiment of the invention and as described hereinafter.

As to the target punching process, after each layer is printed, etched, plated (if necessary) it has adhesive applied to the proper side, the flexible film layer (laminate) is slid between the punched base and the tongue. The flexible layer may be roughly aligned without a microscope in place. By placing the microscope in place, and then adjusting the flexible film layer such as layer 18 so that the inner circle of the target is centered in the microscope eyepiece, one may rotate a clamp arm (not shown) counter-clockwise [to the rear] to secure the flexible film layer between the base and tongue. Rechecking that the target is still centered in the eye piece, the clamp is then loosened and readjustment of the film is effected. After removal of the microscope, a punch is pushed through the bushing. The next step is removing the punch, loosening the clamp, repositioning the microscope and moving onto the next target location on the flexible film layer. Once all targets on all layers have been punched, multi-layer registration and lamination (adhesive fixing) to the printed circuit core and layer by layer buildup may be effected in the order described previously.

As discussed previously, the cross-sectional configuration length and size and configuration of the headed end of the printed circuit board through hole connector pins may vary. Although, all such through hole connector pins are required to have multiple edges defined by intersecting planar surfaces at some angles and forming sharp corners capable of cutting into and/or deflecting the flexible film layers of the stacked laminate structures or arrays as at 14, 16 and 14', 16' on opposite sides of the printed circuit core or substrate 12 All edges are to be as sharp as possible. Additionally, the exterior finish maybe tin-lead over copper, or gold plate. For example, the finish for the illustrated through hole pins 46, 46' maybe 300/500 microinches tin-lead (60/40) over 100/150 micro-inches copper. From the description above, it is clear that the method or process for creating the improved printed circuit board requires the copper conductive sheet to be a flexible copper foil, in turn, on a flexible support (electrical insulation material layer) and to be adhesively adhered together as a multi-layer assemblies on opposite sides of a rigid core, but in such a manner that the sandwich or laminate structure materials remain flexible. Secondly, the copper foil is required to be cantilevered over the edge of the hole drilled in the first rigid substrate functioning as the core for the printed circuit board. Further, the flexible material laminate structure whose flexibility is retained, is required to be adhered to both top and bottom surfaces of a rigid substrate core. Further, a second rigid substrate is utilized as a support for the printed circuit board components and functions as a backup board to shape the flexible bottom layers around the pin geometry, being removed after usage.

The size of the hole in the rigid substrates, the size of the hole in the flexible film layers and the size of the through hole pins are geometrically such that the drilled hole in the rigid substrate functioning as the printed circuit core is very close to the diagonal size of the through hole connector pin and that of the hole through the flexible layers is about equal to the flat to flat sides of the through hole connecter pin. Further, while the through hole pin is shown in cross section as being hexagonal, it may be otherwise such as square, triangular or of any other "edge geometry". Additionally, the pin may be a solid pin rather than a hollow pin while facilitating a copper pin to a copper foil connections from layer to layer via the cutting action of the sharp edges and the depression of surface area of the copper foil cantilevered over the edge of the hole drilled in the ridged substrate forming the core of the printed circuit board. As optional features, a solder coating may be applied to the exterior surface of the pin, and, under certain conditions it is preferred to tin plate the copper films on the flexible layers for improved connection by post-heating after pin penetration.

This is not required for the process to be successfully utilized, particularly where, the computer printed etcher of U.S. Pat. No. 4,767,489 is employed in the production of the metalized film layers to be employed as stacked flexible arrays 14, 14', 16, and 16' in the printed circuit boards resulting from the process.

Reference to FIG. 13 shows the nature of the low impedance electrical connection between the copper foil on the components on the thin, flexible layers of the upper array 14' above the top surface 12a of the substrate or core 12, as a result of the physical penetration of the through hole connector pin 46 contacting the various lands 42 of the copper foil 52 component of the individual layers 18, 19, 20 and 22. By the penetration of the connector pin 46 at its hexagonal cutting edges 54, edges 54 cut and depress the cantilever portions of the layers 18, 19, 20 and 22 which extend radially inwardly of the through hole 32 within the rigid substrate core 12. The copper contacts the pin as per FIG. 13, in areas 90, 92 and 94 between the copper foils 52 of respective layers 18, 19, 20 and 22. This facilitates via the conductive through hole pin 46, circuit completions between copper conductor tracks of respective layers 18, 19, 20 and 22 of the flexible multi-layer 14'. Like circuit completions are effected between the copper clad surface foils of flexible layers 24, 25, 26 and 28 of array 16' beneath the rigid substrate core 12 of the printed circuit board 10' by further penetration of the through hole connector pin 46.

This action is facilitated by the readily enlarged head 48 of the through hole connector 46. This action is the same whether there are only two or three flexible layers for the multi-layer arrays or 10 layers. The parameters may be readily varied including the radial extent of the flexible layer cantilever over the through hole such as 32 within the core 12, FIG. 11, the thickness of the respective films or foils making up the individual flexible layers 18, 19, 20, 22, 24, 25, 26, 28 in FIG. 11 for example, and the make up of those layers in terms of the nature of electrical insulating film, the adhesive layer on the insulating film or on the insulating film opposite the copper cladding, or the copper cladding itself and the thickness of such materials. Additionally, the cross-sectional configuration and dimensions of the through hole connector pin 46 such as that at 46 has an effect on the completion of the low impedance electrical connection from layer to pin to layer etc.

As mentioned previously by pretinning the exterior of the through hole connector pins such as pin 46, FIG. 11, or employing a solder reflow technique as utilized with soldering a lead through a hollow through hole pin such as pin 46 via a bore 52 therein, with additional solder seeking any opening between the periphery of the through hole pin and the deflected and deformed cantilever portions of the top and bottom flexible layer arrays as of 14, 16, 14', 16' etc.

While the invention has been particularly shown and described with reference to a preferred embodiment thereof, it should be understood by those skilled in the art that various changes in form and details and application may be made therein without departing from the spirit and scope of the invention.

What is claimed is:

1. A method of completion of electrical connections between a plurality of conductor tracks, respectively, on a stacked array of multi-layer flexible films mounted to at least one face of a printed circuit board planar substrate having at least one through-hole passing through said core comprising:

drilling a hole through said stacked flexible films at the common location of several overlying conductor tracks of different layers of a diameter less than that of the diameter of the through-hole within said substrate core and aligned with said through-hole to form a cantilever edge portion over the substrate core through-hole, passing a conductive through-hole connector pin through said aligned holes of said flexible film array and said substrate core, said pin having at least one radially outward projecting diameter sharp edge portion having a radius in excess of the radius of the hole through said stacked multi-layer flexible film array but less than the radius of the hole within said substrate core, such that said at least one radial projection sharp corner cuts into the overlying conductor tracks for said multi-layer flexible film array and deflects and deforms the cantilever edge portion of the multi-layer flexible film in the direction of pin insertion into the substrate hole to effect a low impedance conductor track-to pin-to conductor track electrical connection for a plurality of the films of the stacked array upon penetration of the through-hole connector pin through said aligned holes.

2. The method as claimed in claim 1, further comprising coating said conductor tracks, at least in the vicinity of the aligned holes, with solder, such that the penetration of the pin through the aligned holes of said stacked flexible films and said substrate causes reflow of the solder ensuring the low impedance connection between the conductor tracks of the flexible films and the periphery of the through-hole connector pin.

3. The method as claimed in claim 1, wherein said at least one sharp corner comprises a plurality of circumferentially spaced sharp corners about the outer periphery of the through-hole connector pin, and wherein said through-hole connector pin includes flats on the periphery of the pin between the corners, and said method includes folding the thin flexible film multi-layer array along the flats and forcing the conductor tracks at the cantilever edge portion of the array into the substrate core hole during deflection and deformation thereof.

4. The method as claimed in claim 3, wherein the cross-sectional configuration of the through-hole connector pin is polygonal.

5. The method as claimed in claim 4, wherein said cross-sectional configuration of the through-hole connector pin is hexagonal, wherein the flats have a portion intermediate the sharp corners at a minimum radius equal to the film hole diameter of the stacked multi-layer array, and wherein the flats, adjacent to diametrically opposed sharp corners, have a maximum radius equal to one half the through-hole diameter of the substrate core.

6. The method as claimed in claim 1, wherein said through-hole connector pin includes a radially enlarged head on the end of the through-hole connector pin opposite that inserted into the stacked multi-layer flexible film array.

7. The method as claimed in claim 1, wherein the end of said through-hole connector pin projected through said aligned holes of said multi-layer flexible film array and said substrate core is bevelled to facilitate penetration through the aligned holes of said multi-layer flexible film array and said substrate core and deflecting and deforming the cantilever portion of the flexible film multi-layer array into the through-hole of the substrate core.

8. The method as claimed in claim 2, further comprising the step of heating said through-hole connector pin after passage through said aligned holes to cause said solder coating on said conductor tracks to flow after through-hole connection pin insertion and to facilitate low impedance electrical connection between the respective conductor tracks of said multi-layer flexible film array and the periphery of the through-hole connector pin.

9. The method as claimed in claim 1, wherein the respective flexible films of the multi-layer array are respectively adhesively connected to each other and to the surface of the printed circuit board planar substrate core by a melt-remelt adhesive, and said method further comprises applying heat to the through-hole connector pin, after penetrating the multi-layer flexible film array thereby remelting of the adhesive to facilitate deflection and deformation of the multi-layer array of flexible films to ensure contact between the conductor tracks of the respective films and the periphery of the conductive through-hole connector as a result of pin penetration.

10. The method as claimed in claim 1, wherein said through-hole connection pin is axially hollow and said method further comprises mounting an electrical component having electrical leads to the printed circuit board by passing a lead thereof through said hollow through-hole connector pin and flowing solder through the interior of the hollow through-hole connector pin and causing additional solder to penetrate any gaps between the deflected and deformed conductor tracks and the outer periphery of the through-hole connector pin to improve the electrical connection between the through-hole connector pin and the conductor tracks of respective flexible films of the multi-layer stacked array.

11. A method of making a printed circuit board having multiple layers of electrically insulated conductor tracks on at least one face of a printed circuit board planar substrate core comprising the steps of:

applying a heat activated, rapid setting or tacking melt/remelt adhesive onto appropriate surfaces of and etched and plated insulative film for forming a stacked array of multi-layer flexible films;

computer guided drilling of said printed circuit board planar substrate core with prescribed drill sizes at predetermined spaced locations within said core for receiving through-hole connector pins of varying size depending upon the electrical component to be mounted thereto and connected to said conductor tracks;

applying of the etched conductive track layers with adhesive onto the core in a stacked flexible film array in a desired sequence aligned to the drilled hole pattern within the substrate core under application of moderate heat temperature to create a stacked flexible film array on said at least one face of said printed circuit board planar substrate core;

computer guided drilling of the adhered flexible films of said multi-layer flexible film array for each pin size at a given location with the drill size such that the holes within the stacked flexible film array are of a diameter less than that of the diameter of the through-hole within the substrate core and aligned with said through-hole to form a cantilever edge portion of the flexible films over the substrate core through-hole;

insertion of appropriate through-hole connector pins into the aligned holes of said multi-layer stacked flexible film array and said substrate core, said pins having at least one radially outwardly projecting sharp edge portion of a radius in excess of the radius of the hole through said stacked multi-layer flexible film array, but less than the radius of the hole within the substrate core, and wherein the at least one radial projection has a sharp corner which cuts into the overlying conductor tracks for said multi-layer flexible film array and deflects and deforms the cantilever edge portion of the multi-layer flexible films causing a low impedance conductor track-to pin-to conductor track electrical connection for a plurality of the films of the stacked array upon completion of insertion of said through-hole connector pin within said aligned holes.

12. The method as claimed in claim 11, further comprising the step of heating said through-hole connector pin after insertion through said aligned holes, such that the adhesive is remelted to facilitate deflection and deformation of the multi-layer flexible film array, thereby ensuring surface contact between the conductor tracks of the respective films and the periphery of the conductive through-hole connector pin.

13. The method as claimed in claim 11, wherein said through-hole connector pins are axially hollow and said method further comprises the step of mounting at least one electrical component having at least one electrical lead extending therefrom to the printed circuit board by passing said lead through a hollow through-hole connector pin and said method further comprises flowing solder through the interior of the hollow through-hole connector pin about said lead and causing additional solder to penetrate any gaps between the deflected and deformed conductor tracks and the outer periphery of the through-hole connector pin, such that, upon solidification, the electrical connection between the through-hole connector pin and the electrical lead and the conductor tracks of respective flexible films of the multi-layer flexible film stacked array is enhanced.

* * * * *